United States Patent [19]

Ohkawa

[11] Patent Number: 5,095,271
[45] Date of Patent: Mar. 10, 1992

[54] COMPACT OPEN NMR SYSTEMS FOR IN SITU MEASUREMENT OF MOISTURE, SALINITY, AND HYDROCARBONS

[75] Inventor: Tihiro Ohkawa, La Jolla, Calif.
[73] Assignee: General Atomics, San Diego, Calif.
[21] Appl. No.: 522,556
[22] Filed: May 14, 1990
[51] Int. Cl.⁵ .................................... G01R 33/20
[52] U.S. Cl. .................................. 324/307; 324/300
[58] Field of Search .............. 324/300, 307, 309, 318, 324/319; 335/306, 302, 296, 299

[56] References Cited

U.S. PATENT DOCUMENTS

| | | | |
|---|---|---|---|
| 4,538,130 | 8/1985 | Gluckstern et al. | 335/306 |
| 4,614,930 | 9/1986 | Hickey et al. | 335/302 |
| 4,621,236 | 11/1986 | Halbach | 324/319 |
| 4,644,313 | 2/1987 | Miyajima | 335/296 |
| 4,701,736 | 10/1987 | McDougall et al. | 335/299 |
| 4,703,276 | 10/1987 | Beer | 324/319 |
| 4,999,600 | 3/1991 | Aubert | 335/306 |
| 5,014,032 | 5/1991 | Aubert | 335/306 |

Primary Examiner—Michael J. Tokar
Attorney, Agent, or Firm—Nydegger & Associates

[57] ABSTRACT

A nuclear magnetic resonance device has a hollow cylindrical magnet that forms a void. The magnet has a plurality of south poles and an equal plurality of north poles, the poles being dimensioned and disposed on the magnet to establish a toroidal zone external to the magnet wherein the field of the magnet is of substantially constant strength. A solenoidal antenna is positioned within the void of the magnet. Electrical insulating material is positioned to cover the bases of the combined cylindrical structure and may also be disposed between the antenna and the magnet. Associated electronic power, signal processing, and indicating equipment may then be mounted adjacent the electrical insulator and the entire assembly contained in a suitable housing.

27 Claims, 3 Drawing Sheets

COMPACT OPEN NMR SYSTEMS FOR IN SITU MEASUREMENT OF MOISTURE, SALINITY, AND HYDROCARBONS

FIELD OF THE INVENTION

The present invention relates generally to devices which measure the concentration of selected material constituents in a predetermined location. More particularly, the present invention is useful for measuring the moisture, salinity, and hydrocarbon content of a material at a predetermined location by measuring the magnetic resonance of preselected nuclei within the location. The present invention is particularly, though not exclusively, useful for making in situ measurements of the moisture, salinity, and hydrocarbon content of the material at a predetermined location by generating a uniform magnetic field and then measuring the nuclear magnetic resonance of selected nuclei within the field.

BACKGROUND OF THE INVENTION

Nuclear magnetic resonance (NMR) detection is a widely-used technique for the detection of certain materials. For example, in the field of medicine, NMR imaging is used for, among other things, the early detection of tumors. Additionally, the phenomenon of NMR may be used in certain tomographic applications, such as the detection and measurement of the salinity, moisture, and hydrocarbon content of materials that are present in, for example, earth and rock samples, silo grains, or other enclosed structures.

The scientific principle underlying the various NMR applications is relatively simple. As is well known, atomic nuclei will precess at a determinable resonant frequency about an external magnetic field when the field is placed in the presence of the nuclei. When atomic nuclei precess about an external field, they induce in turn their own relatively weak nuclear magnetic fields. It happens that under certain conditions, the individual induced nuclear magnetic fields are additive. Consequently, the relative concentration of a target element nuclei within the magnetic field may be determined by measuring the combined magnetic moment generated by the resonantly rotating nuclei of the target element.

The measuring of the resulting combined magnetic moment of the target nuclei may be accomplished in a number of ways. One common method is to use an electrically conducting coil to measure the magnetic field which is generated by the target nuclei. Then, in accordance with Maxwell's laws, a voltage is induced in the coil by the constantly rotating magnetic moment generated by the precessing target nuclei. This voltage may be measured, and the magnitude of the voltage correlated to the number of nuclei (and, hence, relative concentration of the target element) that are within the uniform magnetic field.

This latter method of using the NMR of nuclei to measure the concentration of certain elements within a target zone generally requires that two conditions be met. The first condition, which is common to all NMR applications, is that the known magnetic field about which the nuclei precess needs to be of substantially uniform magnitude throughout the target zone. Moreover, to optimize signal strength, it is desireable that this generated field be as strong as possible, and, for certain applications, that the target zone be as large as possible. Secondly, again for the purpose of maximizing signal strength, a means to initially induce the target nuclei which are within the zone to precess about the uniform field in phase with each other should be provided. This is so because when the nuclei precess in phase, the magnitudes of the very small, individual nuclear moments which are generated by the nuclei will be additive. Stated differently, if these nuclear moments are out of phase, the resultant combined nuclear magnetic moments will be diminished. On the other hand, when the target nuclei precess in phase, a relatively large signal is generated from which the concentration of the target element within the uniform field zone may be determined.

Many present NMR systems which are used for measuring the content of certain elements in a given material are able to satisfy the above requirements. Unfortunately, because of the nature of the magnetic fields which are generated by typical field sources, such as permanent magnets, these NMR systems are typically able to achieve a field of constant strength only within the magnet. Thus, when a permanent magnet system is used as the field source for NMR applications, it is generally a requirement that the material which is to be examined be placed within the annulus of the magnet system to facilitate NMR tomography of the material. Obviously, in the case of silo grains, earth, etc., it is desirable that a uniform field be generated that is external to the magnet to permit in situ tomography of the material.

The present invention recognizes a need for providing an NMR device which can generate a uniform magnetic field external to the device for tomogaphy of earth, silo grains, and other materials. It is therefore an object of the present invention to provide an NMR device which can establish a substantially uniform magnetic field external to the device. It is a further object of the present invention to provide an NMR device which substantially maximizes the generated signal strength of the target nuclei. Yet another object of the present invention is to provide an NMR device which is easy to use and cost effective to manufacture.

SUMMARY OF THE INVENTION

A nuclear magnetic resonance (NMR) device for measuring the approximate concentration of matter such as water, salinity, and hydrocarbons at a known location, comprises an elongated hollow cylindrical magnet which forms a void therethrough. More specifically, the magnet has a plurality of south poles and a plurality of north poles, the number of north poles being equal to the number of south poles. The poles are disposed on the magnet to establish a toroidal shaped zone that is external to the magnet and through which radially permeates a substantially uniform magnetic field.

In accordance with one embodiment of the present invention, the inner half of the hollow cylindrical shell that is formed by the magnet comprises a single pole having a first polarity. On the other hand, the outer half of the cylindrical shell comprises a single pole which has a second polarity and which forms, in axial order from one end of the cylinder to the other, an odd plurality of annular shaped faces. These faces are separated from each other by annular shaped spacing magnets. Additionally, the annular shaped faces are sized as necessary in the axial dimension of the magnet to establish the toroidal shaped zone, which is accordingly radially permeated by a magnetic field of substantially constant magnitude.

In an alternate embodiment of the present invention, the inner annular half of the shell comprises a magnet that itself has two poles. More particularly, the inner magnet comprises in radial order from innermost pole to outermost pole, a first pole which has a first polarity and a second pole having a second polarity. In contrast, the outer half of the cylindrical shell comprises an odd plurality of magnet segments which are axially stacked the length of the cylinder. Like the magnet which defines the inner one-half of the cylindrical shell, each magnet segment has, in radial order from innermost pole to outermost pole, a first pole of a first polarity and a second pole that has a second polarity. Additionally, the magnet segments are axially separated by spacing magnets.

In either embodiment, in order to detect the resulting combined magnetic moment of the target matter that is within the toroidal zone, a conductor, such as a cylindrical solenoidal coil antenna, is positioned within the void of the magnet. This conductor is positioned within the void of the magnet in substantially coaxial alignment with the cylinder of the magnet to receive the signal generated by the target matter nuclei. Electrical insulation spacing material is then disposed between the conductor and the magnet and over the bases of the cylindrical structure. Associated electronic equipment for indicating the concentration of a particular substance within the toroidal zone, based on the voltage signal that is induced in the coil by the magnetic moment of the target matter, may also be mounted adjacent to the magnet and conductor. The entire assembly is then encased in an appropriate protective housing.

In the operation of the device, an alternating current radiofrequency signal is initially passed through the coil antenna. The frequency of this signal is tuned to match the known natural frequency at which the nuclei of interest within the toroidal zone precess about the uniform magnetic field present in the zone. The effect of the resulting tuned magnetic field that is induced by the current in the coil on the nuclei of interest is to force most of the nuclei to precess in phase about the magnetic field of the magnet. After a period which is sufficient to couple the precession phases of the target nuclei, the alternating current is removed from the coil. With removal of the current from the coil, the now inphase magnetic moments which are generated by the precessing target nuclei in turn induce a voltage in the coil. Because most of the target nuclei are precessing in phase with each other, the magnitude of this induced voltage is proportional to the total number of target nuclei within the toroidal zone. The electronic equipment associated with the device processes this induced voltage signal and consequently indicates the level of concentration of the target nuclei which are located within the toroidal zone.

The novel features of this invention, as well as the invention itself, both as to its structure and its operation, will be best understood from the accompanying drawings, taken in conjunction with the accompanying description, in which similar reference characters refer to similar parts, and in which:

DESCRIPTION OF THE PREFERRED EMBODIMENT

Figure 1:
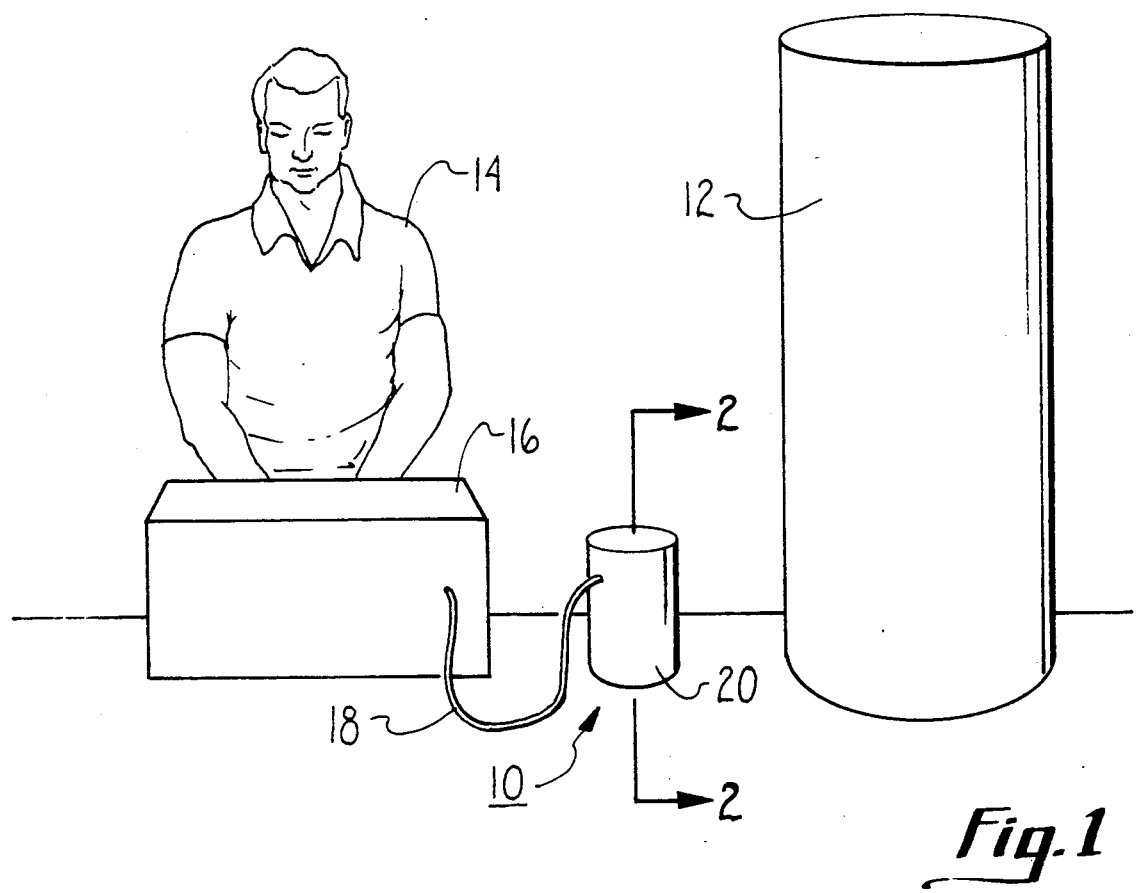
FIG. 1 is a perspective view of the novel compact open nuclear magnetic resonance (NMR) device of the present invention in one intended environment.

Referring initially to FIG. 1, an elongated, generally cylindrical compact open nuclear magnetic resonance (NMR) device, generally designated 10, is shown positioned adjacent container 12 for the purpose of determining the concentration of selected matter (i.e. target nuclei) within container 12, such as water nuclei. It is to be understood, however, that NMR device 10 may be used in a wide variety of other applications to determine the concentration, in various containers or even in earth, of materials such as water, hydrocarbons, and salinity (NaCl). Indeed, NMR device 10 may be used to measure the concentration of any material which exhibits the phenomenon of nuclear magnetic resonance. FIG. 1 shows an operator 14 monitoring power supply and display console 16, which provides indications of the concentration of the target material. While FIG. 1 shows power supply and display console 16 connected to NMR device by line 18, it is to be understood that power supply and display console 16 may be integral to NMR device 10. Thus, it will be understood that NMR device 10 may be powered by alternating current (ac) from an appropriate electrical outlet (not shown), or by a portable direct current (dc) power source. In the latter case, electrical support equipment for converting dc power to ac power will be included in NMR device 10.

Figure 2:
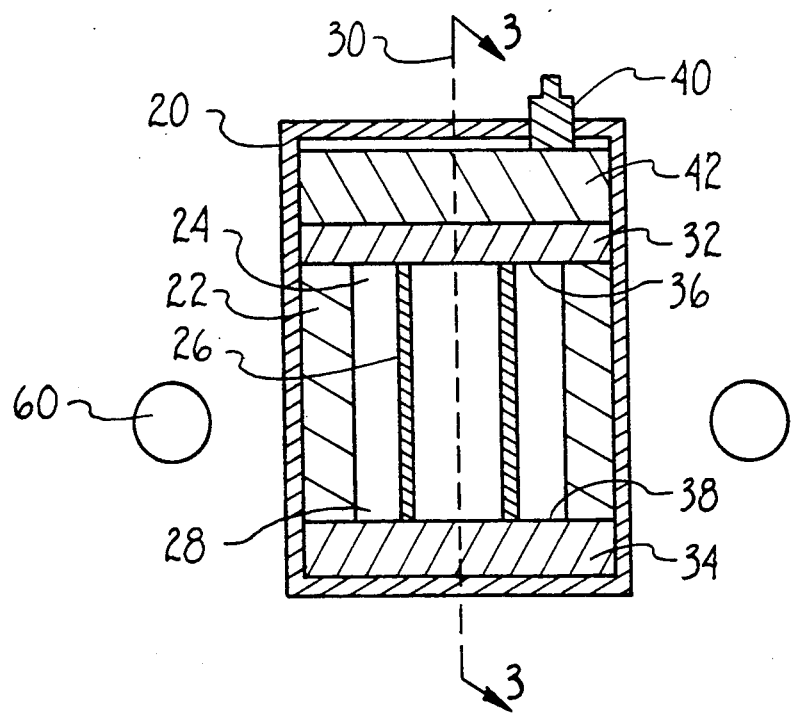
FIG. 2 is a side cross-sectional view of the novel compact open nuclear magnetic resonance (NMR) device of the present invention as seen along the line 2—2 in FIG. 1.

The details of NMR device 10 are perhaps best shown in FIG. 2, where it will be seen that the components of NMR device 10 are supported and protected by a housing 20. Housing 20 comprises a generally cylindrical hollow shell which is composed of any suitable material that is strong enough for supporting the various components of NMR device 10. Additionally, housing 20 is preferably composed of a material which is magnetically permeable and non-ferrous, such as aluminum.

FIG. 2 shows a substantially cylindrical hollow permanent magnet 22 disposed within housing 20. As shown, magnet 22 forms a void 24, within which is positioned a suitable electrical conductor, such as solenoidal antenna 26. According to the present invention, antenna 26 is distanced and separated from magnet 22 by an air gap 28. It will be appreciated that air gap 28 may be filled with any suitable electric insulator and still fall within the scope of the present invention. Moreover, as also shown in FIG. 2, magnet 22 and antenna 26 are coaxially aligned about the axis 30. In addition to the air gap 28, spacer layers 32 and 34 of electrically insulating material are disposed in housing 20 to substantially cover bases 36 and 38, respectively, of the combined magnet 22-antenna 26 structure disclosed above. Also, an electrical cable 40 is shown which penetrates housing 20 and is electrically connected to antenna 26 for powering antenna 26. Signals received by antenna 26 are processed by the electronic componentry which is housed within electronic console 42 (electrical connections not shown).

Figure 3:
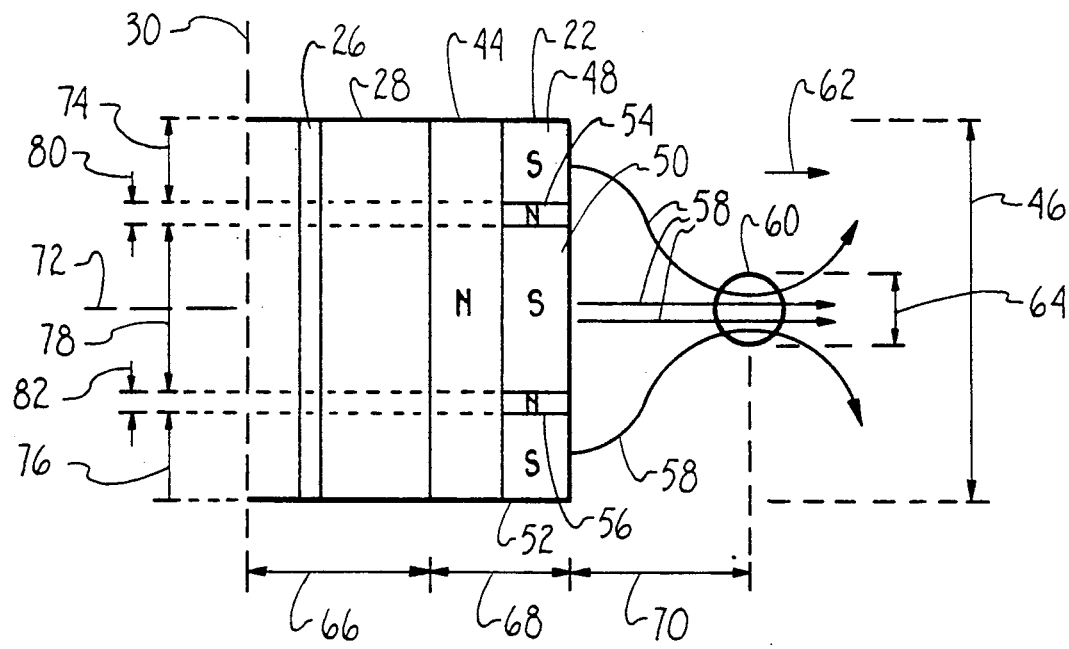
FIG. 3 is a schematic diagram of the operative polar distribution of the permanent magnet device shown in FIG. 2 and the location of these poles relative to an electrical conductor.

Now referring to FIG. 3, the operative polar topography of magnet 22 may be seen to comprise an inner annular north pole 44, which establishes the inner surface of the cylinder of the magnet 22 and is substantially the same axial length 46 as magnet 22. Further, as shown in FIG. 3, pole 44 comprises approximately the inner annular one half of magnet 22. Additionally, three outer annular south poles 48, 50, 52 of substantially equal radii establish part of the outer surface of the cylinder of magnet 22 and comprise the outer annular one half of magnet 22. The south poles 48, 50, 52 are shown separated by two outer annular north poles 54, 56. While FIG. 3 shows three outer annular south poles 48, 50, 52, it is to be understood that the present invention envisions the use of any odd plurality of outer annular south poles which are separated by the appropriate number of outer annular north poles. It will be further appreciated with reference to FIGS. 2 and 3 that all of the annular poles 44, 48, 50, 52, 54, 56 are in coaxial alignment about axis 30.

Figure 4:
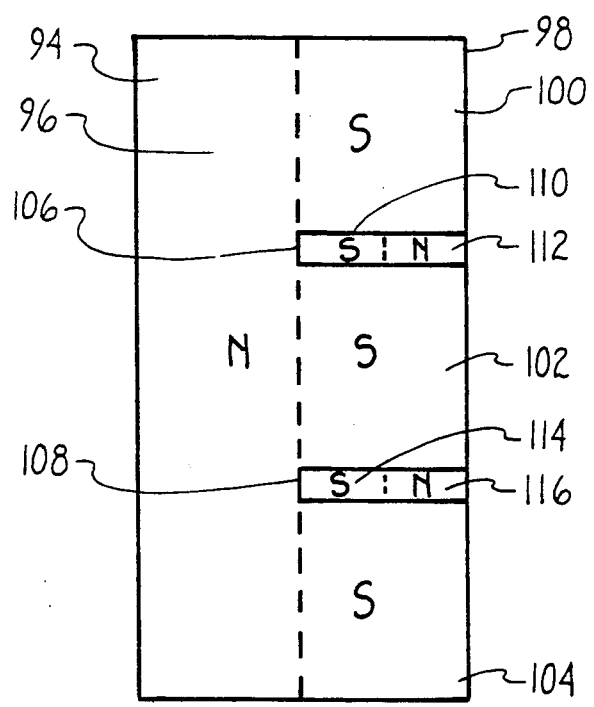
FIG. 4 is a schematic diagram of the novel compact open nuclear magnetic resonance (NMR) device of the present invention showing the method of establishing the operative polar distribution shown in FIG. 3.
Figure 5:
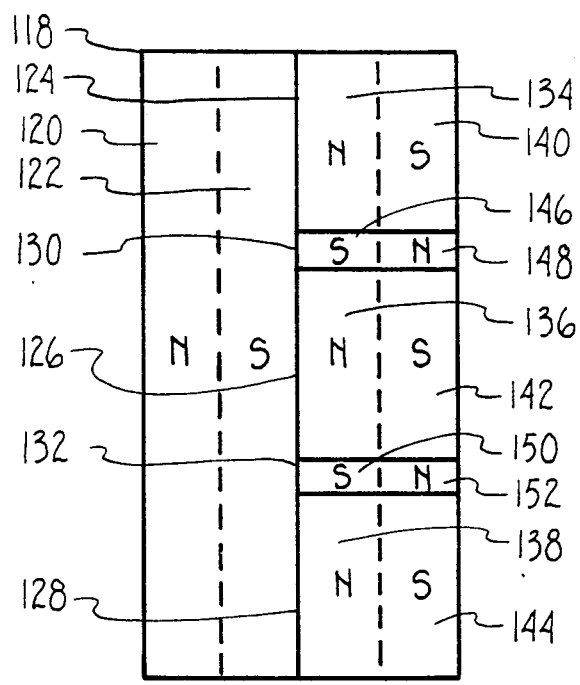
FIG. 5 is a schematic diagram of the novel compact open nuclear magnetic resonance (NMR) device of the present invention showing an alternate method of establishing the operative polar/distribution shown in FIG. 3.

FIG. 3, for simplicity, shows only the operative polar distribution of device 10. As the skilled artisan will recognize, however, the operative polar distribution shown in FIG. 3 may be established a number of ways. For example, FIGS. 4 and 5 show two such methods of establishing the operative polar distribution shown in FIG. 3. Importantly, while FIGS. 3, 4, and 5 show polar distributions wherein certain poles are designated "S" for south and certain other poles designated "N" for north, the designation of the polarities of each of the poles shown may be inverted without departing from the scope of the present invention. More specifically, each of the poles presently designated "N" in FIGS. 3, 4, and 5 may alternatively be designated "S". In such a case, each of the poles presently designated "S" would then necessarily be designated "N".

In FIG. 4, one half of a single annular magnet 94 is schematically shown to comprise an inner annular pole 96 and an outer annular pole 98. As shown, the outer annular pole 98 of the magnet 94 has an odd plurality of axially spaced faces 100, 102, 104. Accordingly, for the particular method shown in FIG. 4 for establishing the polar topography disclosed in FIG. 3, pole 96 in FIG. 4 corresponds to pole 44 in FIG. 3, while faces 100, 102, 104 of pole 98 in FIG. 4 correspond to poles 48, 50, 52 in FIG. 3. As shown in FIG. 4, the faces 100, 102, 104 are axially separated by spacing magnets 106, 108. Importantly, the polarity of the poles 110, 112 of spacing magnet 106 are radially reversed relative to the radial order of the polarity of the poles 96, 98 of magnet 94. Likewise, the polarity of the poles 114, 116 of spacing magnet 108 are radially reversed relative to the radial order of the polarity of poles 96, 98. Thus, poles 112, 116 in FIG. 4 correspond to poles 54, 56 in FIG. 3.

FIG. 5 shows an alternate method of establishing the operative polar distribution shown in FIG. 3. In FIG. 5, an inner annular magnet 118 is shown to have a first, or inner, pole 120 and a second, or outer, pole 122. Additionally, an odd plurality of magnet segments 124, 126, 128 concentrically surround inner magnet 118 and are axially separated by spacing magnets 130, 132. Each of the segments 124, 126, 128 has respective north poles 134, 136, 138 radially disposed between respective south poles 140, 142, 144 and inner annular magnet 118. Thus, poles 120, 140, 142, 144 shown in FIG. 5 correspond, respectively, to poles 44, 48, 50, and 52 shown in FIG. 3. Finally, FIG. 5 shows that the polarities of poles 146, 148 of spacing magnet 130, like the polarity of poles 150, 152 of spacing magnet 132, are radially reversed relative to the polarities of the poles of magnet segments 124, 126, and 128 Thus, poles 148, 152 in FIG. 5 correspond to poles 54, 56 in FIG. 3.

When magnet 22 is thus properly configured, the magnetic flux lines 58 generated by magnet 22 establish a substantially toroidal shaped zone 60 through which radially permeates a magnetic field that has substantially uniform magnitude and direction. This substantially uniform field is represented in FIG. 3 by arrow 62. To achieve this uniform field 62, the precise dimensions of magnet 22 and its associated poles may vary, depending on, among other things, the number of poles disposed on magnet 22 and the desired size of zone 60. Therefore, the following disclosure relates dimensions in terms of the desired minor diameter 64 of zone 60, and taking, as an example, the number of poles shown in FIG. 3.

In the present embodiment, axial length 46 of magnet 22 is approximately sever (7) times the desired size of minor diameter 64 of toroidal zone 60. Moreover, the distance 66, from the inner surface of magnet 22 to axis 30 of NMR device 10, is approximately three (3) times the diameter 64 of toroidal zone 60; distance 68 (i.e., the cross-sectional width of magnet 22) is approximately four (4) times the diameter 64; and distance 70 (the radial distance from the outer surface of magnet 22 to the center of the zone 60 cross-section shown in FIG. 3) is approximately twice the diameter 64. Moreover, it is to be appreciated that south poles 48 and 52 are symmetrically sized and symmetrically disposed about axis 30 and are each approximately 2 times diameter 64 in their axial dimensions 74 and 76, respectively. Additionally, it is to be understood that in accordance with the disclosure above, south pole 50 is symmetric about both axis 30 and radial center line 72 of magnet 22, and is approximately twice the diameter 64 in its axial dimension 78. As shown in FIG. 3, the axial dimensions 80, 82 of symmetric north poles 54, 56, respectively are relatively thinner than the axial dimensions of south poles 48, 50, 52, and are about one half (0.5) the diameter 64. As the skilled artisan will recognize, for embodiments of NMR device 10 which incorporate a greater odd number of south poles, south pole 50 will remain symmetrically disposed about axes 30 and 72 substantially as disclosed above. It will be the case, however, that the additional south poles (separated from each other as appropriate by north poles) will be symmetrically sized and axially stacked adjacent poles 48 and 52. To illustrate, as an example, NMR device 10 may incorporate two more south poles, in addition to the three poles 48, 50, 52 shown in FIG. 3, for a total of five south poles. In this case, the fourth annular south pole would be established on magnet 22 adjacent pole 48 (appropriately separated from pole 48 by a fourth north pole) and axially opposite pole 50. Likewise, the fifth annular south pole would be established on magnet 22 adjacent pole 52 (separated from pole 52 by a fifth north pole) on the side of pole 52 which is opposite pole 50. Because these two additional south poles (and their associated north poles) would increase the axial length 46 of the outer annular one half of magnet 22, north pole 44 (i.e., the inner annular one half of magnet 22) would be proportionately lengthened in the axial dimension in this exemplary embodiment.

OPERATION

Figure 6:
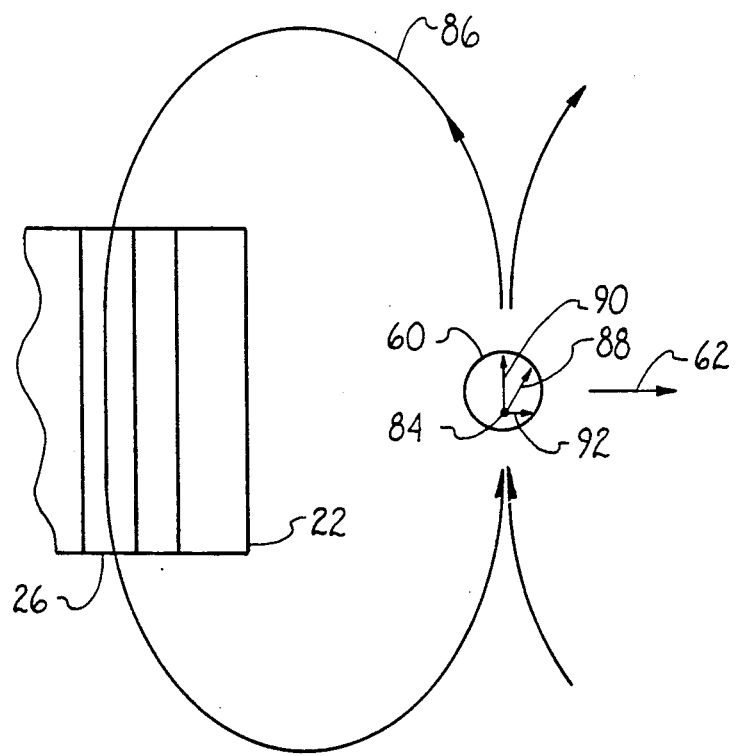
FIG. 6 is a schematic diagram of a portion of the novel compact open nuclear magnetic resonance (NMR) device of the present invention showing the magnetic field lines which are generated by a single nuclei as it precesses about the magnetic field of the permanent magnet.

In the operation of NMR device 10, reference is initially made to FIGS. 3 and 6. After NMR device 10 has been positioned adjacent to the body or container to be monitored, a radio frequency (rf) signal is passed through antenna 26. As the skilled artisan will appreciate, a corresponding magnetic field about NMR device 10 is thereby generated, in accordance with Maxwell's laws. It is to be understood that this field is in addition to the existing field 62 of permanent magnet 22. Target nuclei within zone 60, which are already precessing about field 62 of permanent magnet 22, will shift the phases and directions of their individual respective precessions to substantially equal the phase of the rf signal that is being passed through magnet 22. Thus, when the rf signal is passed through magnet 22 at the proper frequency, the target nuclei within zone 60 will begin to precess in phase. Accordingly, the individual magnetic fields which are generated by each precessing target nuclei also rotate in phase. As is well known in the art, the proper frequency of the rf signal in antenna 26 for locking precessions of the target nuclei in phase, as disclosed above, is equal to the natural resonant frequency at which the individual target nuclei precess about field 62. This frequency may be determined by multiplying the gyromagnetic ratio of the target nucleus by the magnitude of the uniform field 62 that exists within the zone 60.

After a period which is sufficient to lock the individual precessions of the target nuclei in phase, the rf signal through antenna 26 is terminated. Typically, the rf signal is maintained through antenna 26 for several seconds. Then, a suitable electronic monitoring device, such as a voltmeter (not shown), may be connected to antenna 26 to measure the combined magnitude of the fields generated by the individual target nuclei within zone 60. This combined magnetic field magnitude, which is proportional to the concentration of target nuclei within zone 60, may be correlated by the electronics in console 42 to a target nuclei concentration equivalent and then appropriately displayed. More particularly, as shown in FIG. 6, as a target nucleus within zone 60 (represented by dot 84) precesses about field 62, it generates a relatively tiny nuclear magnetic field. One such field is represented by field lines 86 in FIG. 4. Additionally, for illustration purposes, arrow 88 represents the instantaneous magnitude and direction of this individual nuclear magnetic field. The normal components of this nuclear field 88, which accordingly vary sinusoidally between zero and their maximum absolute values, are represented by arrows 90, 92. As the skilled artisan will appreciate, the magnitude of the normal component 90 of nuclear field 88 will be reflected in antenna 26 by a corresponding induced voltage in antenna 26, according to Maxwell's laws. Moreover, because a majority of all target nuclei within zone 60 are precessing substantially in phase, in accordance with previous disclosure, the induced voltage in antenna 26 is proportional to the total number, or concentration, of the target nuclei within zone 60.

While the particular compact open NMR systems for in situ measurement of moisture, salinity, and hydrocarbons as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as defined in the appended claims.

I claim:

1. A nuclear magnetic resonance device for detecting the approximate concentration of matter at a known location, which comprises:
   an elongated cylindrical magnet forming a void and having a plurality of south poles and a plurality of north poles equal to the number of south poles, said poles being dimensioned and disposed on said magnet to establish a zone external to said void, said zone having a magnetic field permeating therethrough of substantially uniform magnitude; and
   an elongated electrical conductor disposed in said void coaxially with said magnet to be influenced by said matter for generating a signal proportional to said concentration of matter within said zone.

2. A nuclear magnetic resonance device for detecting the approximate concentration of matter at a known location as recited in claim 1 wherein said magnet comprises an inner annular pole having a first polarity and an outer annular pole having a second polarity, said outer pole having an odd plurality of axially spaced faces, said faces being respectively separated by spacing magnets, each of said spacing magnets having a first pole of said first polarity and a second pole of said second polarity, said second poles of said spacing magnets being disposed between said inner annular pole and respective said first poles of said spacing magnets.

3. A nuclear magnetic resonance device for detecting the approximate concentration of matter at a known location as recited in claim 1 wherein said conductor comprises a coil.

4. A nuclear magnetic resonance device for detecting the approximate concentration of matter at a known location as recited in claim 1 further comprising means connected to said conductor for energizing said conductor and indicating said concentration of matter based on said proportional signal.

5. A nuclear magnetic resonance device for detecting the approximate concentration of matter at a known location as recited in claim 4 further comprising an electrically nonconductive layer disposed intermediate said magnet and said energizing means.

6. A nuclear magnetic resonance device for detecting the approximate concentration of matter at a known location as recited in claim 5 wherein said device is enclosed in a protective housing.

7. A nuclear magnetic resonance device for detecting the approximate concentration of matter at a known location as recited in claim 1 wherein said zone is substantially toroidal-shaped, and said magnetic field radially permeates said zone.

8. A nuclear magnetic resonance device for detecting the approximate concentration of matter at a known location as recited in claim 7 wherein the axial length of said cylindrical magnet is approximately seven (7) times the minor diameter of said toroidal zone.

9. A nuclear magnetic resonance device for detecting the approximate concentration of matter at a known location as recited in claim 1, wherein said magnet comprises an inner annular magnet and an outer annular magnet, said inner magnet comprising, in radial order, an inner pole having a first polarity and an outer pole having a second polarity, said outer magnet comprising, in axial order, an odd number of annular magnet segments, said segments being axially separated by spacing magnets.

10. A nuclear magnetic resonance device for detecting the approximate concentration of matter at a known location as recited in claim 9 wherein each of said segments has a first pole of said first polarity and a second pole of said second polarity, each of said first poles being radially disposed between its respective said second pole and said inner annular magnet.

11. A nuclear magnetic resonance device for detecting the approximate concentration of matter at a known location as recited in claim 10 wherein each of said spacing magnets has a first pole of said first polarity and a second pole of said second polarity, said second poles of said spacing magnets being disposed between said inner annular pole and respective said first poles of said spacing magnets.

12. A device for determining the approximate concentration of a known material at a known location, which comprises:
   magnetic means for establishing a substantially toroidal-shaped zone external to said means, said zone having a substantially uniform magnetic field permeating therethrough; and
   electrically conductive means inductively coupled to said magnetic means for generating an electrical signal in response to the magnetic moment of said material in said zone, said signal being proportional to said concentration of material within said zone.

13. A device for determining the approximate concentration of a known material at a known location as recited in claim 12, wherein said magnetic means comprises an elongated cylindrical magnet forming a void and having a plurality of south poles and a plurality of north poles equal to the number of south poles, said poles being dimensioned and disposed on said magnet to establish said zone.

14. A device for determining the approximate concentration of a known material at a known location as recited in claim 13 wherein said magnet comprises an inner annular pole having a first polarity and an outer annular pole having a second polarity, said outer pole having an odd plurality of axially spaced faces, said faces being respectively separated by spacing magnets, each of said spacing magnets having a first pole of said first polarity and a second pole of said second polarity, said second poles of said spacing magnets being disposed between said inner annular pole and respective said first poles of said spacing magnets.

15. A device for determining the approximate concentration of a known material at a known location as recited in claim 14 wherein said conductor means comprises a coil.

16. A device for determining the approximate concentration of a known material at a known location as recited in claim 15 wherein said coil is disposed within said void of said magnet in coaxial alignment with said magnet.

17. A device for determining the approximate concentration of a known material at a known location as recited in claim 16 further comprising means connected to said coil for energizing said coil and indicating said concentration of matter based on said proportional signal.

18. A device for determining the approximate concentration of a known material at a known location as recited in claim 17 further comprising an electrically nonconductive layer disposed intermediate said magnet and said energizing means.

19. A device for determining the approximate concentration of a known material at a known location as recited in claim 18 wherein said device is enclosed in a protective housing.

20. A device for determining the approximate concentration of a known material at a known location as recited in claim 19 wherein said field radially permeates said zone.

21. A device for determining the approximate concentration of a known material at a known location as recited in claim 20 wherein the axial length of said cylindrical magnet is approximately seven (7) times the minor diameter of said toroidal zone.

22. A device for determining the approximate concentration of a known material at a known location as recited in claim 13 said magnet comprises an inner annular magnet and an outer annular magnet, said inner magnet comprising, in radial order, an inner pole having a first polarity and an outer pole having a second polarity, said outer magnet comprising, in axial order, an odd number of annular magnet segments, said segments being axially separated by spacing magnets.

23. A device for determining the approximate concentration of a known material at a known location as recited in claim 22 wherein each of said segments has a first pole of said first polarity and a second pole of said second polarity, each of said first poles being radially disposed between its respective said second pole and said inner annular magnet.

24. A device for determining the approximate concentration of a known material at a known location as recited in claim 23 wherein each of said spacing magnets has a first pole of said first polarity and a second pole of said second polarity, said second poles of said spacing magnets being disposed between said inner annular pole and respective said first poles of said spacing magnets.

25. A method for determining the concentration of a known material in a known zone using a cylindrically-shaped annular magnet device, comprising the steps of:
   disposing a plurality of annular south poles and an equal plurality of annular north poles on said magnet to establish a substantially uniform magnetic field external to said magnet device;
   positioning said magnet device adjacent said zone to establish said uniform magnetic field substantially coincident with said zone; and
   generating an electrical signal in response to the induced magnetic moment of said material in said zone, said signal being proportional to said concentration of material in said zone.

26. A method for determining the concentration of a known material in a known zone using a cylindrically-shaped annular magnet device as recited in claim 25 further comprising the steps of:
   electrically smoothing said electrical signal;
   amplifying said electrical signal; and displaying said electrical signal to indicate said concentration of said material within said zone.

27. A method for determining the concentration of a known material in a known zone using a cylindrically-shaped annular magnet device as recited in claim 25 wherein at least one of said north poles comprises approximately the inner annular one half of said magnet and said south poles comprise, in axial sequence, the outer annular one half of said magnet, said south poles being axially separated by the remainder of said north poles.

* * * * *